United States Patent [19]

Harrah et al.

[11] Patent Number: 4,594,493
[45] Date of Patent: Jun. 10, 1986

[54] METHOD AND APPARATUS FOR FORMING BALL BONDS

[75] Inventors: Shane Harrah, Palo Alto; William Phy, Los Altos Hills, both of Calif.

[73] Assignee: Fairchild Camera & Instrument Corp., Cupertino, Calif.

[21] Appl. No.: 517,190

[22] Filed: Jul. 25, 1983

[51] Int. Cl.$^4$ .............................................. B23K 31/00
[52] U.S. Cl. .............................. 219/56.22; 219/56.21; 219/74
[58] Field of Search ................. 219/56.1, 56.21, 56.22; 228/4.5, 173 E; 29/838, 839

[56] References Cited

U.S. PATENT DOCUMENTS

| 652,607 | 6/1900 | Hanks | 228/173 E |
| 4,323,759 | 4/1982 | Edson et al. | 219/56.22 |
| 4,476,365 | 10/1984 | Kurtz et al. | 219/56.22 |

FOREIGN PATENT DOCUMENTS

| 57-64944 | 4/1982 | Japan | 228/173 E |
| 2086297 | 5/1982 | United Kingdom | 219/56.21 |

Primary Examiner—Clifford C. Shaw
Attorney, Agent, or Firm—Burns, Doane, Swecker & Mathis

[57] ABSTRACT

The present invention relates to a method and apparatus for forming a ball bond between a fine wire such as aluminum wire and a surface with the ball bond being approximately radially symmetric about a principal axis of a portion of the wire. The apparatus may include a plurality of electrodes radially spaced about the wire to define gaps between each electrode and the tip of the wire and a plurality of resistance elements. A voltage source may be connected to form a circuit consisting of plural electrically parallel legs, each of which includes the series combination of a resistance element, an electrode and an arc path between the electrode and the tip of the wire. A molten ball is formed at the end of the wire when arcs are essentially simultaneously produced between the electrodes and the tip of the wire. In a preferred embodiment, the resistances of the resistance elements are approximately equal. In addition, the plurality of electrodes are preferably symmetrically spaced about the wire to define gaps of nearly equal length between each electrode and the tip of the wire.

17 Claims, 7 Drawing Figures

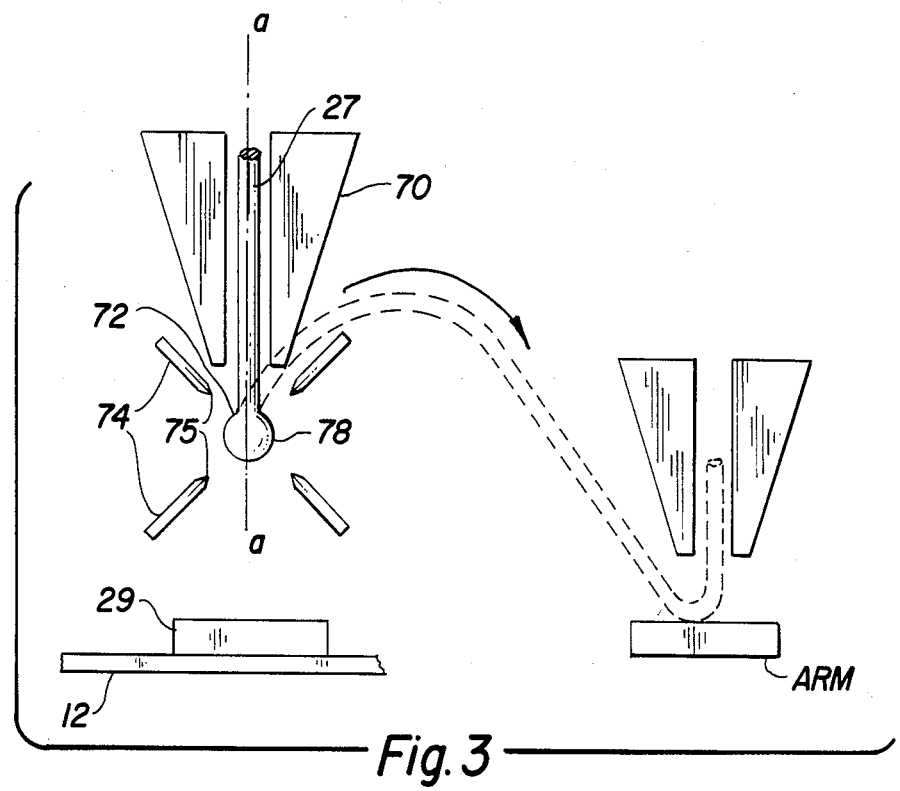
Fig. 3
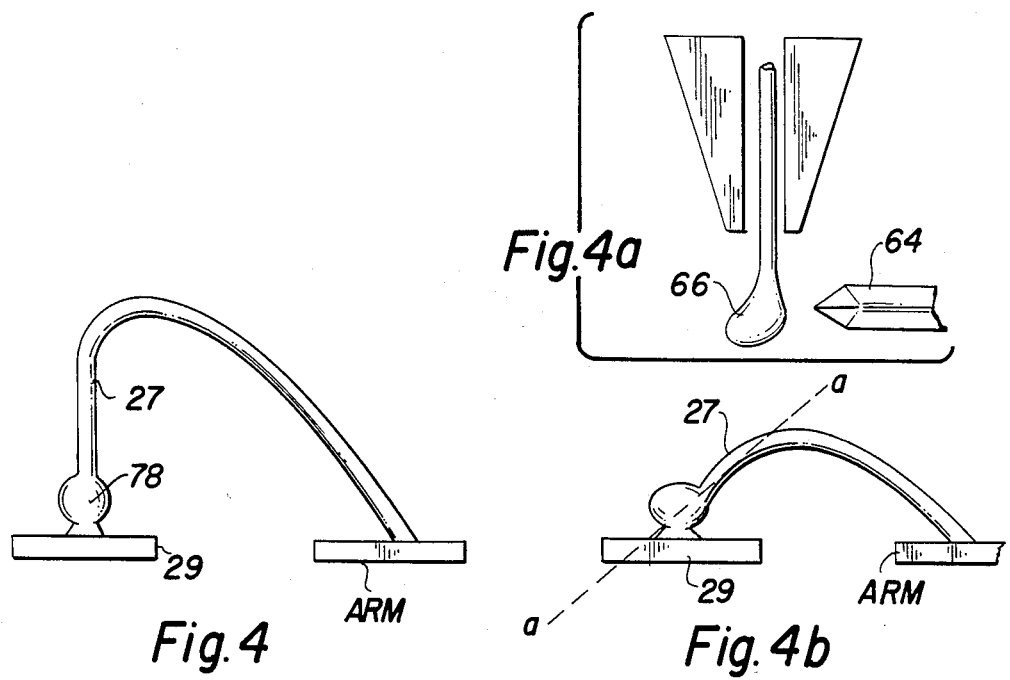
Fig. 4a
Fig. 4
Fig. 4b

METHOD AND APPARATUS FOR FORMING BALL BONDS

BACKGROUND OF THE INVENTION

The present invention relates to methods and apparatus for forming ball bonds in a wire used to make electrical contact with small electrical circuits such as semiconductor integrated circuits. More specifically, one form of the present invention relates to a method and apparatus for forming ball bonds in which a molten ball is formed at a tip of an aluminum wire employing arcs which are essentially simultaneously produced between the tip of a wire and a plurality of electrodes symmetrically disposed around the tip.

In most conventional semiconductor devices, a silicon chip or die is electrically connected to a plurality of arms of a lead frame by segments of fine gold wire for ball bonding or segments of aluminum wire for ultrasonic bonding. Typically, ends of each lead frame arm are located adjacent to and arranged generally radially about the edges of the chip. A corresponding plurality of contact pads are formed in a similar, generally radial array around the peripheral edges of the chip. The contact pads provide electrical connections to electrical structures within the chip. Such a conventional structure is described in greater detail below in connection with FIGS. 1 and 2.

In many conventional applications, the segments of gold wire extend between each pad and its corresponding lead frame arm in order to conduct the electrical current therebetween. Normally, a tip of the wire is drawn through a capillary positioned above the pad and melted to form a molten mass having a ball shape. In many instances, however, the ball is not radially symmetric relative to a principal axis of the wire. When the bond is made, a radially asymmetric ball or "golf club" may be formed in which the wire is predisposed against bending in some directions. Such a radially asymmetric ball or golf club is described in greater detail in connection with FIG. 4a and 4b.

In conventional ball bonding techniques, the ball is affixed to the semiconductor pad. The capillary is then moved laterally towards the corresponding lead frame arm, thereby bending the wire in an arching or bridging configuration towards the corresponding arm. In most applications requiring large numbers of leads and, in particular, in conventional dual-in-line device packages, the lead frame arms are positioned in a generally radial array about the periphery of the chip. The arching or bridging of the wire between each pad and its corresponding arm results in wires being bent in different radial directions. In those instances where golf club bonds are formed, a particular wire may be bent in a direction opposite to the predisposed direction. Such bending can create stress in the wire or bond which could cause a fracture, thereby breaking the electrical path between the pad and the arm.

A well-known expedient for obtaining more symmetric ball bonds is to employ gold wire. In forming the ball bond with gold wire, an arc from a single electrode or flame from a jet is directed toward the tip of the gold wire to melt it. Due to the physical properties of the gold (e.g., surface tension, resistance to oxidation), the melted tip forms a relatively uniform spherical shape in most instances. A principal disadvantage lies in the expense of the gold. Additionally, for reasons of economics, mechanical durability, etc., it may be desirable to make the lead frame arms and pads from materials other than gold. However, when diverse metals are used in the current path from chip to lead, galvanic reactions may occur which could cause deterioration in the electrical connections to the chip.

Accordingly, it would be desirable to use an aluminum wire connected between an aluminum lead frame arm and pad since the use of aluminum would be less expensive and the use of the same metal throughout would inhibit galvanic reactions. However, the physical properties of aluminum create further difficulties in the formation of an aluminum ball with conventional bonding apparatus.

In U.S. Pat. No. 4,098,447 to Edson et al, a method and apparatus are disclosed for forming ball bonds in aluminum wires. The patent teaches the formation of a molten ball by bringing the aluminum wire and a single electrode into temporary contact in a shielding atmosphere, and applying a voltage of less than 200 volts to create a spark discharge. In the method disclosed in U.S. Pat. No. 4,323,759 to Edson et al, a ball bond is formed by initiating a spark discharge across a gap between the aluminum wire and a single electrode in a shielding atmosphere. In this method, a relatively high peak current density is employed.

The above-mentioned techniques create a discharge between a single electrode and the aluminum wire. As a result, a preferential or directionally unbalanced force may act on the tip of the wire. With such an apparatus, a radially asymmetric ball bond may be formed, rather than a well-centered, radially symmetric ball bond.

An object of the present invention is to provide a method and apparatus for forming ball bonds which reduce the difficulties associated with the prior art.

A further object of the present invention is to provide a method and apparatus for forming radially symmetric ball bond from aluminum wire or other type of wire using balanced arc forces.

A further object of the present invention is to provide a method and apparatus for forming ball bonds which reduce the creation of stresses within the wire or bond upon bending.

It is an additional object of the present invention to provide a method and apparatus for forming a ball bond which inhibit the formation of golf club bonds.

It is a further object of the present invention to provide a method and apparatus for forming ball bonds which are less expensive and less likely to cause galvanic reactions within the semiconductor device.

These and other objects and features of the present invention will be apparent from this written description and the appended drawings.

SUMMARY OF THE INVENTION

The invention relates to a method and apparatus for forming ball bonds between an aluminum wire and a surface whereby the ball is approximately radially symmetric relative to the principal axis of the wire. The apparatus includes a plurality of electrodes spaced about the wire to define gaps between each electrode and a tip of the wire and a plurality of resistance elements. A voltage source is connected to the electrodes to form a circuit consisting of plural, electrically parallel legs, each of which may include the series combination of a resistance element, an electrode and an arc path between the electrode and the tip of the wire. A molten ball is formed in the tip of the wire when arcs are essentially simultaneously produced between the electrode and the tip of the wire. The apparatus may also include a mechanism for placing the ball and the surface in contact with one another.

The present invention also relates to a method for forming a ball bond between a wire and a surface, with the ball bond being approximately radially symmetric about a principal axis of the wire. The method includes the steps of symmetrically positioning a plurality of electrodes about a tip of the wire with each electrode being connected in series with a resistance element and an arc path between each electrode and the tip of the wire. A voltage source is applied to each electrode and arc path. Arcs are essentially simultaneously produced between the wire and each electrode to form the ball at the tip of the wire. The ball and the surface are then brought into contact with one another.

BRIEF DESCRIPTION OF THE DRAWINGS

Preferred embodiments of the present invention will be described with reference to the accompanying figures, wherein like elements bear like reference numerals and wherein:

FIG. 3 is a side view of an apparatus of an embodiment of the present invention for forming ball bonds;

FIG. 4 is a side view of the ball bond on a pad with the wire extending from the pad to a lead frame arm;

FIGS. 4a and 4b are sequential side views illustrating the formation of the golf club ball bond.

DETAILED DESCRIPTION

Figure 1:
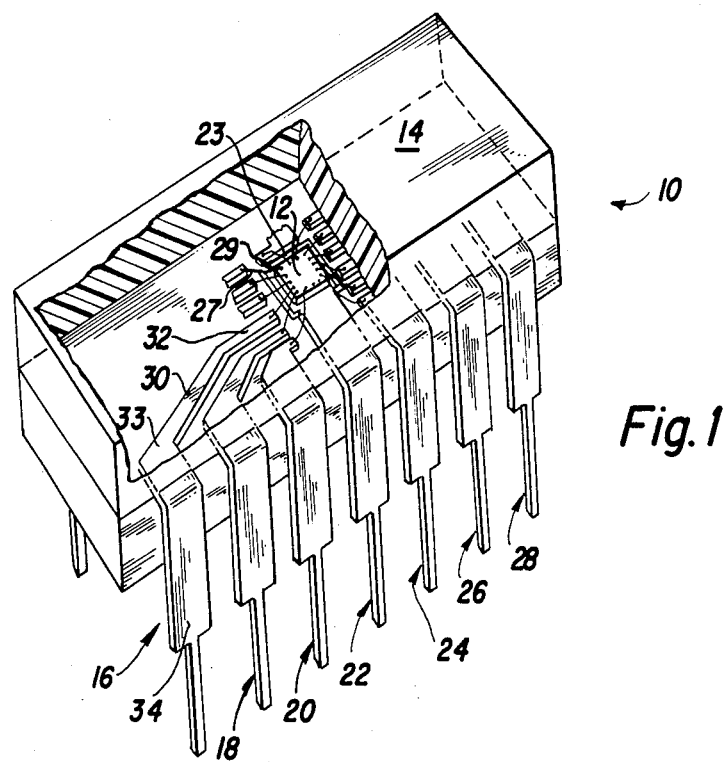
FIG. 1 is an enlarged perspective view of a packaged semiconductor device showing a portion broken away to expose a semiconductor chip.

An embodiment of the present invention will be described with reference to FIG. 1 which illustrates an exemplary structure consisting of a plastic dual-in-line package (P-DIP) semiconductor device 10 including a silicon chip or die 12 contained within a plastic body 14. Leads 16, 18, 20, 22, 24, 26 and 28 are encased in the plastic body and are electrically connected to the chip. Counterpart leads (not shown) are located on an opposite side of the P-DIP semiconductor device 10. The leads may be formed from any suitable electrically conductive material, but the leads are preferably fabricated from aluminum. The lead structures may be fabricated in the conventional manner by bonding one side of the chip 12 to a paddle portion 23 of a stamped lead frame.

Each lead may have an external portion projecting from the package and an interior portion with an internal end or arm located adjacent to the chip 12. For example, a first lead 16 has an external portion 34 which is adapted for connection to an external electrical circuit such as a printed circuit board. An interior part 30 of the first lead 16 is integral with the external portion 34 for conducting electrical current therebetween. An internal arm 32 of the interior part 30 is located closely adjacent to the chip 12.

Figure 2:
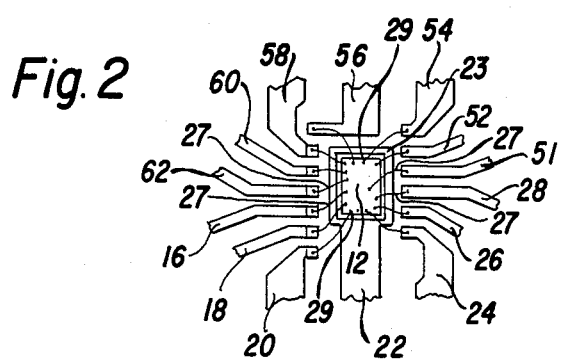
FIG. 2 is an enlarged plan view of the chip of FIG. 1 encircled by lead frame arms.

FIG. 2 illustrates the leads encircling the chip 12. Each of thirteen leads has an arm closely adjacent to the chip 12. A fourteenth lead 22 terminates in the paddle portion 23 to which one side of the chip 12 may be bonded. The arms of the other leads are arranged about the perimeter edge of the chip in a generally radial array. A plurality of electrical connection support pads 29 are located in a similar generally radial array on the peripheral margin of the chip 12. Preferably, the number of pads 29 corresponds to the number of leads. Moreover, it is preferable if the pads are fabricated from the same material as the leads so as to avoid galvanic reactions.

An interconnecting wire 27 extends between each pad 29 and its corresponding lead frame arm for conducting electrical current between the chip and the lead. The wire 27 has a small diameter, typically 1.25 mils or 31.75 microns. Consequently, the wire 27 is fragile and likely to fracture when subjected to stress. Accordingly, it is desirable that any method or apparatus for attachment of the wire to both the pad and the lead frame arm minimize the stress to which the wire is subjected.

In conventional methods for attaching the gold wire to the chip, a tip of the wire is drawn through a capillary and melted to form a ball of molten material at the tip of the wire. In conventional processes, the tip of the wire is melted by directing a single capacitance discharge or arc from a single electrode positioned to one side of the capillary. The arc bridges a gap between the electrode and the wire, thereby forming an ionized path for conducting electricity to the wire. The tip is then placed into contact with the pad in order to attach the wire thereto.

Preferably, the melting and attachment of the wire to the pad creates a spherical ball of molten material with the ball being radially symmetric relative to a principal axis of the wire. Such radial symmetry permits the wire to be bent in any direction towards a corresponding lead frame arm without creating undue stress in the wire or bond. As previously noted, the stress could cause the wire or bond to fracture and thereby disrupt the electrical connection between the lead frame arm and the chip.

However, conventional attachment methods may not consistently form well-centered, radially symmetric ball bonds with wire made of different elements or alloys. For example, the use of a single electrode 64 for melting the wire as shown in FIG. 4a may impose unbalanced forces on the molten end of the wire, a phenomenon sometimes referred to as arc pressure or arc blow. Off-centered ball bonds may then result from the unbalance. Such an off-centered or golf club type ball bond is illustrated in FIG. 4b. As shown, a ball 66 is not radially symmetric relative to the principal axis a—a of the portion of wire 27 adjacent to the ball. Further, a circular equator of the ball cannot be oriented parallel to the bonding pad or surface. Accordingly, upon bonding of the wire 27 to the pad 29, the wire may be predisposed to bend in a particular direction. Bending of the wire in a direction other than the predisposed direction may create stresses in the wire or bond.

The use of gold wires may minimize the non-symmetry of the ball bond because the physical properties of gold (e.g., surface tension, resistance to oxidation) facilitate the formation of a well-centered ball. However, the use of gold is expensive. Moreover, using gold risks the occurrence of intermetallic reactions between the gold and the aluminum pads or lead frame arms and, at elevated temperatures such as occur at glass sealing, the occurrence of a phenomenon sometimes referred to as "purple plague" which is believed to involve the formation of $Au_2Al_3$ or other deleterious intermetallic compositions. Thus, the use of aluminum wire may be more desirable. However, aluminum wire, when used in conventional bonding techniques, does not form radially centered symmetric ball bonds due to its physical properties. Furthermore, the arc force from a conventional single electrode may not provide the stability needed to produce a radially symmetric aluminum ball bond.

An embodiment of the present invention will now be described with reference to FIG. 3 which illustrates an apparatus for forming a well-centered, radially symmetric ball bond from a wire fabricated from gold, aluminum or any other conductive metal. As illustrated, the wire 27 is fed through a capillary 70 positioned above a pad 29. A tip 72 of the wire is exposed beneath the capillary 70.

In accordance with the present invention, the exposed tip 72 of the wire is surrounded by a plurality of electrode rods 74 having conical ends 75. It is noted that the plurality of electrodes rods may include three or more electrode rods. The electrode rods 74 are preferably arranged in a symmetrical, radial configuration with the ends 75 of the rods being approximately equidistant in a radial direction from the wire 27. In a preferred embodiment, the electrode rods 74 lie in generally the same plane which is normally perpendicular to the axis a—a of the portion of the wire from which the ball is formed.

As illustrated, four electrode rods 74 are symmetrically spaced around the tip 72 of the wire 27 so as to be 90° apart. Preferably, the electrodes and tip are relatively movable. In this manner, the electrode rods 74 may be approximately positioned beneath the capillary when the tip is to be melted and then relatively moved to accommodate further operations performed by the capillary moving relative to the chip. It should be noted that the electrode rod 74 may be supported on various structures, such as the annulus 76 shown in FIG. 5. Other structures may include an electrode rod 74 positioned on an individually movable arm which extends toward the wire. Furthermore, it is not required to have exactly four electrodes. For example, three electrodes may be spaced at 120° intervals or five electrodes may be spaced at 72° intervals.

Once in position around the wire 27, an arc is essentially simultaneously produced between each rod 74 and the wire 27. Since the arcs are nearly simultaneous, approximately equal in force and symmetrically directed from electrodes located in the same plane, the wire is subjected to nearly balanced arc forces or arc pressures, thereby facilitating the formation of a spherical ball. Heat generated by the simultaneous, symmetrically oriented arcs melts the tip of the wire, thereby forming the ball 78 of molten material at the tip, the ball being radially symmetric with respect to the principal axis a—a of the wire 27.

The molten ball freezes or hardens while retaining its spherical shape. The frozen ball may then be placed in contact with the pad. The ball may be bonded to the pad by mildly heating the pad (e.g., to approximately 80° C.) and applying thermosonic energy through the capillary 70. The capillary 70 then moves laterally towards the corresponding lead frame arm, thereby drawing the wire out of the capillary and bending it toward the pad (shown by dotted lines in FIG. 3). Once positioned over the corresponding lead frame arm, the capillary moves downward sandwiching the wire between the capillary and the pad to form a thermo-compression or thermosonic bond between the wire and the pad. Subsequent abrupt movement of the capillary may be employed to shear the wire to form a new tip which may then be ball bonded to another pad. This cycle is repeated for each remaining pad and its corresponding lead frame arm.

Preferably, the wire and electrodes are surrounded by a reducing atmosphere or gas, such as an inert gas/reducing gas mixture, flowing along the axis of the wire in a laminar fashion. The function of the gas is to provide a media for striking the arc and to inhibit or reverse oxidation of the wire (especially aluminum wire) as it melts and rehardens. In a preferred embodiment, the reducing gas is a mixture of hydrogen and noble gases such as helium or argon.

A radially symmetric ball bond is illustrated in FIG. 4. As shown, the wire 27 extends between the pad 29 and the corresponding lead frame arm. Since the ball 78 is radially symmetric with respect to the principal axis a—a of the wire 27, the wire is not disposed to bending in any particular radial direction towards its corresponding lead frame arm. This facilitates the bending of the wire between corresponding pads and lead frame arms in different various radial directions. This may be contrasted to the asymmetric, golf club ball bond illustrated in FIG. 4a.

Figure 5:
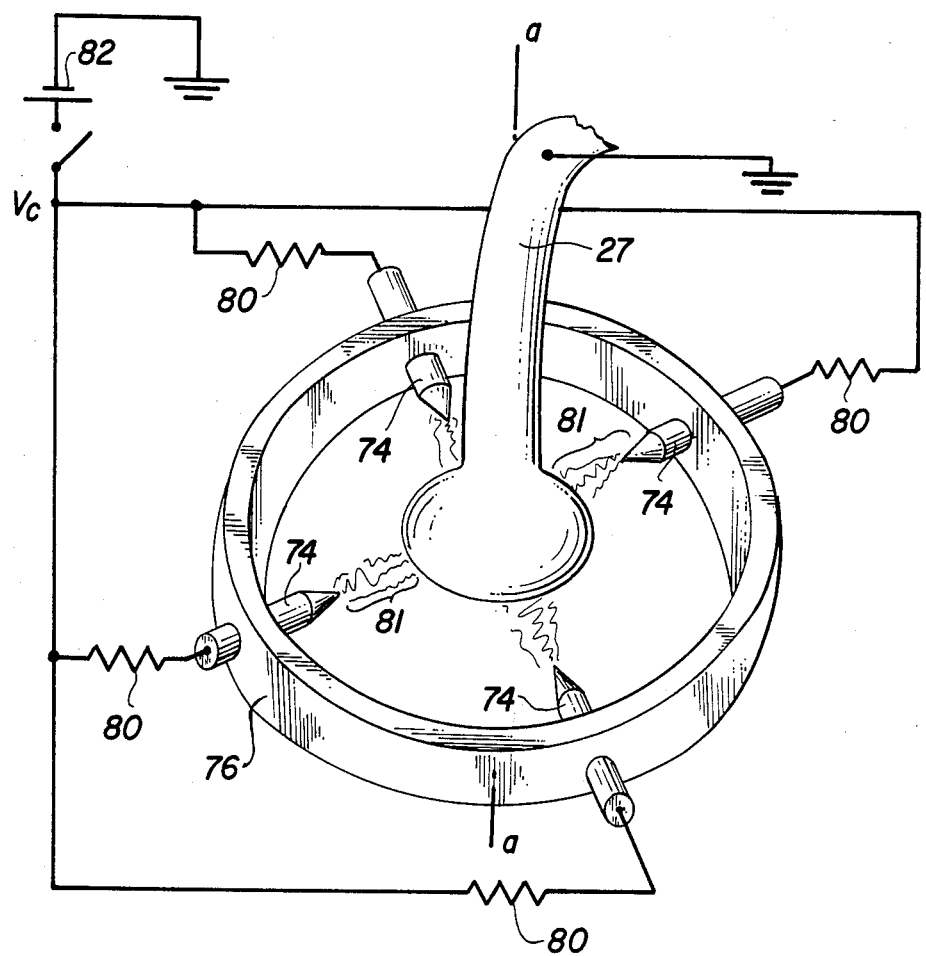
FIG. 5 is a pictorial view of an apparatus for forming ball bonds illustrating, in schematic form, an electrical circuit which may be employed according to the teachings of the present invention.

An embodiment of the present invention will now be described with reference to FIG. 5 which illustrates an electrical circuit that aids the production of a generally balanced, simultaneous discharge of the electrodes, even if the wire is not equidistantly spaced from the electrodes. The circuit includes a voltage source 82 connected to form a circuit consisting of plural electrically parallel legs. Each leg includes the series combination of a resistance element 80, an electrode 74 and an arc path 81 between the electrodes and the tip of the wire. The voltage source 82 is capable of producing a short duration electrical pulse on command. A capacitor bank may be used as such as a voltage source.

Advantageously, the resistors may be of the same resistance. With this arrangement of equal resistors connected in series, single electrode discharges are inhibited. If a discharge starts at only one electrode (probably the electrode closest to the wire), then the increase current going through that electrode would result in an increased voltage drop across the resistor connected to that electrode. If the resistance is large enough, then such a voltage drop would decrease the voltage across a first gap between the nearest electrode and wire so as to inhibit the arc discharge at that electrode. The voltage across the other gaps between the other electrodes and the wire would be greater, resulting in arc discharges occurring in the other gaps. Accordingly, the individual resistors act as a current divider for the current from the voltage source, thereby ensuring that relatively balanced arcs occur at all the electrodes, even when the wire is not equidistantly spaced from the electrodes or when other unbalanced conditions exist which might lead to an asymmetric discharge.

Typical values for a ball bonding system are:
Voltaqe Source=1.2 KV volts
Resistors 80=80 to 100 ohms
Range of Arc Lengths=10-20 mils (250-510 microns)
Wire Thickness=1.25 mil diamter (31.75 microns)
The rods may, for example, be made of high purity graphite.

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. An apparatus for forming a ball bond between an aluminum wire and a surface, the ball bond being approximately radially symmetric about a principal axis of a portion of the wire from which it is formed, the apparatus comprising:
 a plurality of electrodes radially spaced about the wire to define gaps between each electrode and a tip of the wire;
 a plurality of resistance elements;
 a voltage source connected to form a circuit consisting of plural, electrically parallel legs, each including the series combination of a resistance element, an electrode and an arc path between the electrode and the tip of the wire, whereby a molten ball is formed in the tip of the wire when arcs are essentially simultaneously produced between the electrode and the tip of the wire; and
 means for placing the ball and the surface in contact with one another.

2. The apparatus according to claim 1, wherein resistances of the resistance elements are approximately equal.

3. The apparatus according to claim 1, wherein the voltage source is a capacitor bank.

4. The apparatus according to claim 1, wherein the plurality of electrodes lie approximately in a plane perpendicular to the principal axis of the wire.

5. The apparatus according to claim 1, wherein the plurality of electrodes are four in number and are symmetrically positioned in a radial array about the wire at intervals of approximately 90°.

6. The apparatus according to claim 1, wherein the electrodes are generally equidistant in a radial direction from the tip of the wire.

7. The apparatus according to claim 1, further comprising means for providing a reducing atmosphere about the electrodes and the wire tip.

8. The apparatus according to claim 1, further comprising means for providing a reducing atmosphere about the electrodes and the wire tip which includes a mixture of a reducing gas and an inert gas.

9. The apparatus according to claim 8, wherein the reducing gas is hydrogen and the inert gas includes at least one of the group of argon and helium.

10. The apparatus according to claim 1, further comprising means for flowing the gas mixture along the principal axis of the wire in a laminar fashion.

11. The apparatus of claim 1 wherein said voltage source provides a voltage to said resistance elements and said resistance elements have a resistance value such that stable arcs having substantially equal force are formed essentially simultaneously between all of the electrodes and the wire through a range of gap distances corresponding to the variations encountered in the positioning of the wire with respect to the electrodes.

12. An apparatus for forming a ball bond between a wire and a surface, the ball bond being approximately radially symmetric about a principal axis of a portion of the wire, the apparatus comprising:
 a plurality of electrodes radially spaced about a tip of the wire to define gaps of approximately equal length between each electrode and the tip,
 a voltage source for selective electrical connection of one polarity to each electrode and of the other polarity to the wire to essentially simulatneously produce an arc between each electrode and the tip of the wire to form a molten ball in the tip of the wire;
 means for providing a mixture of an inert gas and a reducing gas at the tip of the wire in order to inhibit oxidation of the tip of the wire; and
 means for placing the ball and the surface in contact with one another.

13. An apparatus for forming a molten ball at a tip of a wire to permit ball bonding of the wire to a surface, the apparatus comprising:
 a plurality of electrodes symmetrically positioned about the wire to define generally equidistant gaps between each electrode and the tip of the wire;
 a plurality of resistance elements; and
 a voltage source connected to form a circuit consisting of plural, electrically parallel legs, each including the series combination of a resistance element, an electrode and an arc path across the gap, whereby a molten ball is formed in the end of the wire when arcs are essentially simultaneously produced across the gaps.

14. The apparatus according to claim 13 wherein the wire is aluminum.

15. A method for forming a ball bond between a wire and a surface, the ball bond being approximately radially symmetric about a principal axis of the wire, the method including the steps of:
 symmetrically positioning a plurality of electrodes about a tip of a wire, each electrode being connected in series with a resistance element and an arc path between each electrode and the tip of the wire;
 applying a voltage source in parallel to each series combination of the electrode, the resistance element and the arc path;
 essentially simultaneously producing an arc between the wire and the electrode to form the ball at the tip of the wire; and
 placing the ball and the surface in contact with one another.

16. The method according to claim 15, wherein the wire is made of aluminum.

17. An apparatus for forming a ball bond between a wire and a surface, the ball bond being approximately radially symmetric about a principal axis of a portion of the wire, the apparatus comprising:
 four electrodes symetrically positioned in a radial array about a tip of the wire at intervals of approximately 90° to define gaps of approximately equal length between each electrode and the tip;
 a voltage source for selective electrical connection to the electrodes to essentially simultaneously produce an arc between each electrode and the tip of the wire to form a molten ball in the tip of the wire;
 means for providing a mixture of an inert gas and a reducing gas at the tip of the wire in order to inhibit oxidation of the tip of the wire; and
 means for placing the ball and the surface in contact with one another.

* * * * *